United States Patent [19]
Fischman et al.

[11] 4,001,641
[45] Jan. 4, 1977

[54] HORIZONTAL DEFLECTION SYSTEM

[75] Inventors: Martin Fischman, Seneca Falls; Jesse H. L'Hommedieu, Waterloo, both of N.Y.

[73] Assignee: GTE Sylvania Incorporated, Stamford, Conn.

[22] Filed: July 30, 1975

[21] Appl. No.: 600,405

[52] U.S. Cl. .............................. 315/408
[51] Int. Cl.² ................. H01J 29/70; H01J 29/76
[58] Field of Search .............. 315/399, 405, 408; 307/246, 253

[56] References Cited
UNITED STATES PATENTS

| | | | |
|---|---|---|---|
| 3,129,354 | 4/1964 | Hellstrom | 307/253 |
| 3,411,032 | 11/1968 | Liu | 315/405 |
| 3,434,003 | 3/1969 | Geller | 315/408 |

Primary Examiner—Maynard R. Wilbur
Assistant Examiner—T. M. Blum
Attorney, Agent, or Firm—Norman J. O'Malley; Robert E. Walrath; Robert T. Orner

[57] ABSTRACT

A horizontal deflection system with a transformer coupled driver including separate turn-on and turn-off drivers coupled to first and second input windings of the driver transformer is shown. The output winding of the driver transformer is loosely coupled to the first input winding to provide a sawtooth drive current to the horizontal output transistor sufficient to maintain the horizontal output transistor in saturation without wasting excessive power. The output winding is tightly coupled to the second input winding to provide a sharp turn-off pulse to the horizontal output transistor.

9 Claims, 4 Drawing Figures

HORIZONTAL DEFLECTION SYSTEM

CROSS-REFERENCE TO RELATED APPLICATIONS

M. Fischman et al., "Horizontal Deflection System" (Ser. No. 600,403), and M. Fischman et al., "Horizontal Deflection System," (Ser. No. 600,404), filed concurrently herewith and assigned to the same assignee as the present invention.

FIELD OF THE INVENTION

This invention relates to horizontal deflection systems and more particularly to transformer coupled driver circuitry for horizontal deflection systems.

BACKGROUND OF THE INVENTION

Typical prior art deflection systems in common use in television receivers include a fixed duty cycle horizontal oscillator coupled by a driver transistor and driver transformer to a horizontal output transistor. The horizontal output transistor is connected to a horizontal deflection winding contained in a yoke associated with a cathode ray tube. The objective of this circuitry is to deflect the electron beam or beams in the cathode ray tube in the horizontal direction at a relatively high rate such as 15,734 lines per second as is used in the NTSC system.

The design of the driver and horizontal output transistor stages is very critical. In typically prior art circuits the horizontal output transistor conducts during the last half of the trace interval and is sharply cut-off to initiate retrace. During retrace a large retrace or flyback voltage appears at the collector of the horizontal output transistor. If the horizontal output transistor is conducting when this voltage appears, the retrace current will be altered and the transistor will dissipate excessive power which generally will result in damage to the transistor. Since the horizontal output transistor is conducting heavily immediately before retrace is initiated, the stored charge in the base and collector regions of the transistor must be removed before the transistor will cease conducting collector current. Normally this stored charge is removed by applying a negative pulse to the base of an NPN transistor to cause a reverse base current to flow. This negative pulse, however, should be applied only as long as necessary to alleviate the voltage stress on the collector-base junction during retrace. R. J. Walker and R. Yu, "Horizontal Output Transistor Base Circuit Design," IEEE Transactions On Broadcast and Television Receivers, Vol. BRT-20, August 1974, pp. 185–192, describe the various design requirements for the base circuit of the horizontal output transistor.

The above design requirements place severe limitations on the horizontal driver transistor and transformer design. In typical circuits conduction by the driver transistor during retrace and the first half of trace switches the output transistor off. The driver transformer stores energy during conduction by the driver transistor which is used to provide forward base current to the horizontal output transistor during the following conduction interval of the output transistor. Accordingly, the drive current in the primary winding must be of the proper amplitude and duration to maintain the horizontal output transistor in conduction in saturation during the second half of trace. When the driver transistor turns on again, the initial current flow through the primary winding of the driver transformer provides a turn-off pulse to the base of the output transistor. The amplitude and duration of the turn-off pulse are dependent on the inductances and the turns ratio of the driver transformer windings.

The critical design requirements of the driver and output stages also necessitates a well-regulated voltage supply for both the driver circuitry and the output circuitry. Accordingly, typical prior art horizontal deflection systems are energized by a voltage supply derived from rectification of the line voltage, but regulated so that the voltage levels vary within narrow limits. Typical prior art voltage regulators used for this purpose include series regulators and constant voltage power transformers as well as other similar circuitry.

One form of known voltage regulator is a switching regulator which regulates by varying the conduction time of a switch with the amplitude of the unregulated voltage. In horizontal deflection systems the horizontal output transistor is operated as a switch. Since the horizontal output transistor does not conduct during the entire trace interval, the portion that it does not conduct deflection current can be used for regulation. P. L. Wessel, "A New Horizontal Output Deflection Circuit," IEEE Transactions on Broadcast and Television Receivers, Vol. BTR-18, August 1972, pp 177–182, and M. J. Maytum, "Transistorized Self-Stabilizing Horizontal-Deflection Systems," IEEE Transactions On Broadcast and Television Receivers, Vol. BTR-20, February 1974, pp. 32–64, describe various self-regulating horizontal deflection circuits. In such circuits the horizontal output transistor is isolated from the deflection winding during that portion of trace when the damper or trace diode is conducting. During this time, the output of the horizontal oscillator is pulse width modulated so that the conduction time of the horizontal output transistor varies over relatively broad limits sufficient to provide regulation of an unregulated voltage supply and to compensate for load variations.

In prior art fixed duty cycle deflection systems, the base drive provided by the driver transformer to the horizontal output transistor is initially large and decays exponentially to a magnitude sufficient to maintain the horizontal output transistor in saturation at the end of trace. Accordingly, excessive base drive is provided throughout most of the conduction interval of the horizontal output transistor thereby dissipating excessive power and generating excessive heat. In self-regulating horizontal deflection systems the drive requirements are even more severe because the conduction and non-conduction intervals vary. Thus, the driver transistor and driver transformer must provide sufficient base drive to cause the horizontal output transistor to conduct in saturation for its longest potential conduction interval. Using typical prior art techniques, however, the base drive would be greatly in excess of that required when the horizontal output transistor is conducting for its minimum conduction interval. Accordingly, in known prior art transformer coupled drivers in both fixed duty cycle and self-regulating horizontal deflection systems the driver circuitry provides excessive base drive to the horizontal output transistor thereby dissipating excessive power and generating excessive heat.

OBJECTS OF THE INVENTION

Accordingly, it is a primary object of this invention to provide a horizontal deflection system which overcomes the above noted and other disadvantages of the prior art.

It is a further object of this invention to provide driver circuitry for a horizontal deflection system which conserves power without deleteriously affecting the operation of the deflection system.

It is a further object of this invention to provide driver circuitry for a horizontal deflection system in which the forward and reverse drive signals are determined independently.

It is a yet further object of this invention to provide driver circuitry for a self-regulating horizontal deflection system which provides sufficient drive signals over widely varying duty cycles without excessive power dissipation.

SUMMARY OF THE INVENTION

In one aspect of this invention the above and other objects and advantages are achieved in a horizontal deflection system for a television receiver having an oscillator for providing a signal synchronized with a received composite video signal, a deflection yoke associated with a cathode ray tube, and a deflection circuit. The deflection circuit includes a horizontal output transistor, first and second semiconductor drivers, and a transformer. The horizontal output transistor has an output electrode connected in circuit with the deflection yoke for providing a sawtooth deflection current thereto. The transformer has an output winding connected to an input electrode of the horizontal output transistor, a first input winding which has a low coupling coefficient with the output winding and a second input winding which has a high coupling coefficient with the output winding. The first semiconductor driver is connected to the oscillator and to the first input winding for providing a sawtooth drive current from the output winding to the input electrode sufficient to cause the horizontal output transistor to conduct in saturation in response to energization of the first input winding by the first semiconductor driver. The second semiconductor driver is connected to the oscillator and to the second input winding for causing a reverse current to flow from the input electrode to rapidly switch the horizontal output transistor to a non-conducting state.

DETAILED DESCRIPTION OF THE PREFERRED EMBODIMENT

For a better understanding of the present invention, together with other and further objects, advantages and capabilities thereof, reference is made to the following disclosure in conjunction with the accompanying drawings.

Figure 1:
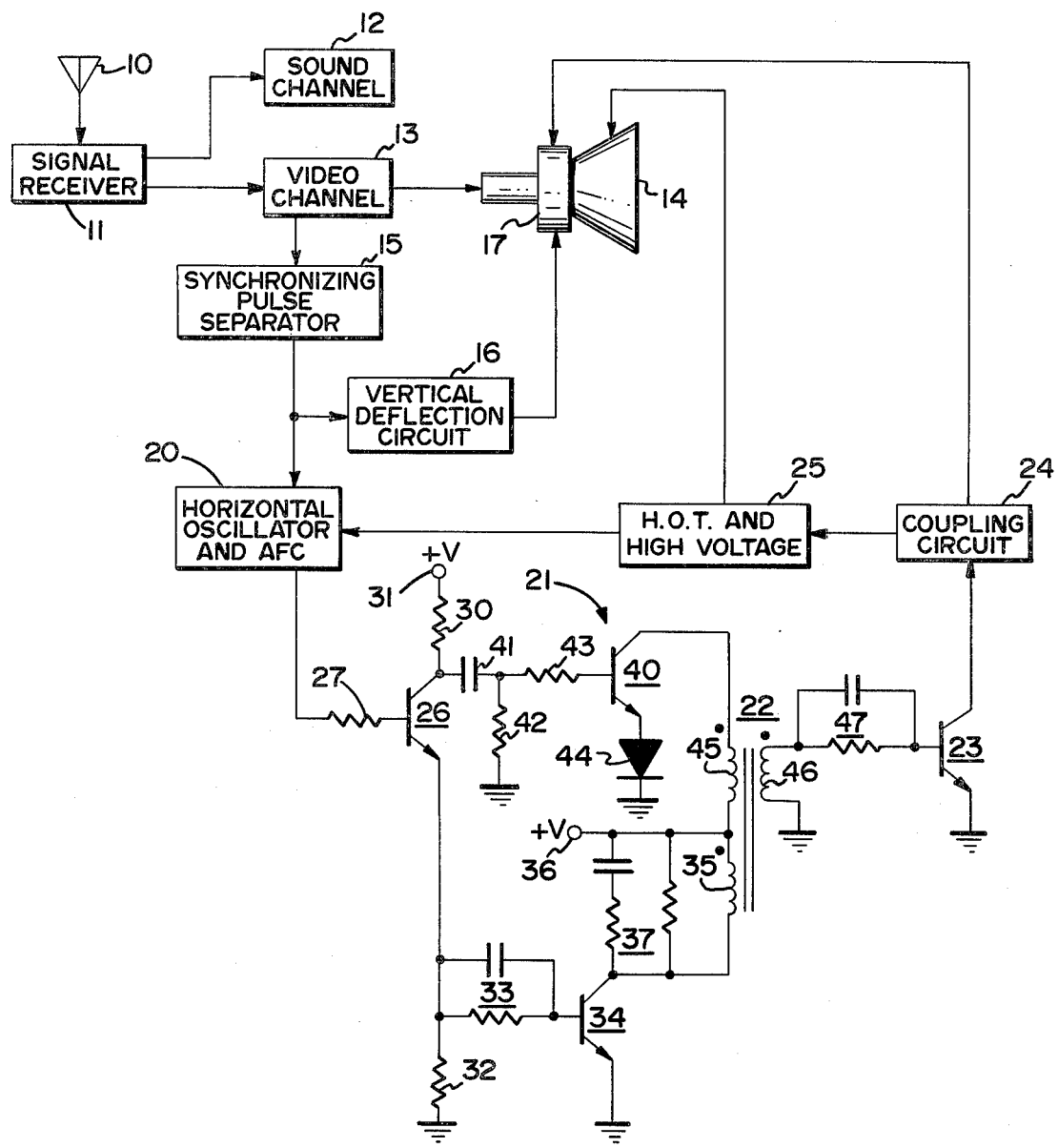
FIG. 1 is a block and schematic diagram of one embodiment of the invention incorporated in a television receiver.

In FIG. 1 typical components of a television receiver are shown in block form while the preferred embodiment of the invention is shown schematically. An antenna 10 or equivalent signal receiving means is connected to a signal receiver 11 which includes the usual radio frequency, intermediate frequency, and automatic gain control circuitry. Signal receiver 11 provides the sound portion of the received signal to a sound channel 12 and the video portion to a video channel 13. Video channel 13 includes the usual luminance circuitry, and in case of a color television receiver, the usual chrominance circuitry. One or more video signals from video channel 13 are coupled to a cathode ray tube (CRT) 14. The composite video signal is coupled from video channel 13 to a synchronizing pulse separator 15. Separator 15 couples separated vertical synchronizing pulses to a vertical deflection circuit 16 which provides a vertical deflection signal synchronized with a received composite video signal to a vertical deflection winding contained in a yoke 17 associated with CRT 14 in the usual manner.

Separator 15 also couples separated horizontal synchronizing pulses to horizontal oscillator and automatic frequency control (AFC) circuit 20. Horizontal oscillator 20 is coupled to a deflection circuit which includes a semiconductor driver 21 coupled by a driver transformer 22 to a horizontal output stage including a horizontal output transistor 23. An output electrode illustrated as a collector of transistor 23 is connected in circuit with a horizontal deflection winding contained in yoke 17 by a coupling circuit 24. The collector of transistor 23 is further connected to a horizontal output transformer and high voltage circuit 25. Circuit 25 provides the usual high voltage operating potentials to CRT 14 and a feedback signal to horizontal oscillator and AFC 20 to synchronize the output signal from the oscillator and hence the horizontal deflection of the electron beam or beams in CRT 14 with the received composite video signal. The horizontal deflection system can be either a predetermined or fixed duty cycle or a self-regulating system of the types illustrated and described in the above-referenced co-pending application Ser. No. 660,403.

Semiconductor driver 21 includes a transistor 26 having a base connected via a resistor 27 to an output of horizontal oscillator 20. A collector of transistor 26 is connected via a resistor 30 to a source of operating potential illustrated as a terminal 31 and an emitter is connected via a resistor 32 to circuit ground. The emitter of transistor 26 is further connected by a parallel RC circuit 33 to a first semiconductor driver or transistor switch illustrated as a base of a transistor 34. Transistor 34 has an emitter connected to circuit ground and a collector connected by a first input winding 35 of transformer 22 to a source of energizing potential illustrated as a terminal 36. A damping circuit 37 is connected in parallel with winding 35. The collector of transistor 26 is connected to a second semiconductor driver or transistor switch illustrated as a transistor 40. The collector of transistor 26 is connected by a capacitor 41 in series with a resistor 42 to circuit ground with the junction of capacitor 41 and resistor 42 being connected by a resistor 43 to a base of transistor 40. Transistor 40 has an emitter connected by a diode 44 to circuit ground and a collector connected by a second input winding 45 of transformer 22 to source 36.

Transformer 22 further has an output winding 46 with one end connected to circuit ground and the other end connected by a parallel RC circuit 47 to an input electrode illustrated as a base of horizontal output transistor 23. Transistor 23 has an emitter connected to circuit ground.

In operation, oscillator 20 provides pulses to driver circuit 21 which are coupled via transformer 22 to horizontal output transistor 23. At the start of trace the damper or trace diode in coupling circuit 24 is conducting current to the horizontal deflection winding in the usual manner. When the electron beams are scanning at approximately the center of the screen of CRT 14, transistor 23 begins conducting to provide a sawtooth signal to the deflection winding during the second half of trace. The collector current of transistor 23 is generally illustrated by sawtooth waveform 50 of FIG. 2. Waveform 50 represents current flow from the deflection winding in yoke 17 through coupling circuit 24 and transistor 23. Retrace is initiated by sharply cutting-off transistor 23. In accordance with standard practice, the horizontal deflection winding oscillates for one-half cycle to reverse the current therethrough during retrace. At the end of retrace and the start of trace, the damper diode again couples current to the deflection winding for the first half of trace.

In typical prior art transformer coupled horizontal deflection circuits, the base drive current for transistor 23 is intially high and decays to a value sufficient to maintain transistor 23 in conduction in saturation at the end of trace. Since the amount of base current necessary to saturate a transistor is proportional to the collector current, it is readily seen that a large initial base current is not necessary to saturate transistor 23 when the collector current follows waveform 50 of FIG. 2. By providing a large initial base current, or a base current larger than necessary, power is dissipated and wasted usually in the form of heat generation which is also undesirable.

Figure 2:
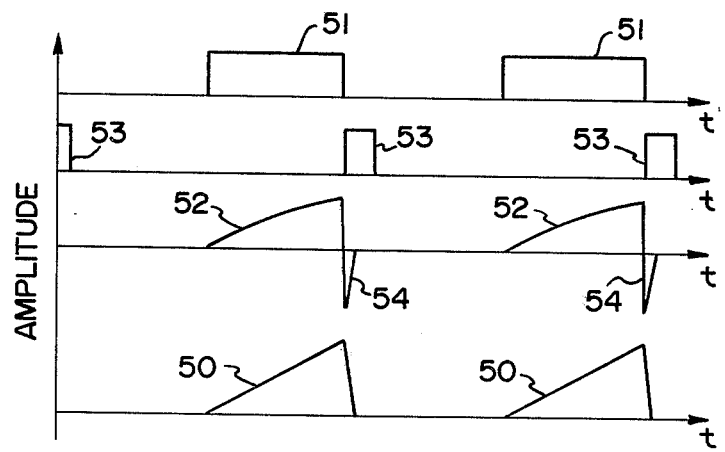
FIGS. 2 and 3 are waveform timing diagrams to aid in explaining the operation of the invention.

In a deflection circuit in accordance with the invention, oscillator 20 provides pulses to the base of transistor 26 to switch transistor 26 on and off. When transistor 26 switches on, pulses 51 of FIG. 2 are provided to the base of transistor 34 to switch transistor 34 on. When transistor 34 is switched on, a current path is completed from source 36 through input winding 35. Winding 35 is "loosely coupled" to winding 46 so that a substantial leakage inductance is provided therebetween. This loose coupling is provided by designing transformer 22 such that windings 35 and 46 have a relatively low mutual inductance or coupling coefficient therebetween. The relatively low mutual inductance together with the number of turns in each winding and the turns ratio are selected so that the leakage inductance and the resistance in series with winding 46 provide a generally sawtooth base drive current to transistor 23. The base drive current is illustrated in FIG. 2 by waveform 52 wherein the base drive current of transistor 23 is sufficient to reliably maintain transistor 23 in saturation but does not dissipate excessive power.

As was discussed above, transistor 23 must be sharply cut-off so that the collector current of transistor 23 does not flow during retrace when the large retrace of flyback voltage appears at the collector thereof. If transistor 23 is conducting collector current at this time, it will deleteriously affect the deflection retrace and will subject transistor 23 to damage. Accordingly, retrace is initiated by transistor 26 switching off in response to the output pulse of oscillator 20. Transistor 34 also switches off so that current flow through input winding 35 ceases. The leakage inductance which provided desirable forward drive characteristics, however, inhibits a sharp turn-off pulse from rapidly cutting transistor 23 off. Accordingly, the second semiconductor driver including transistor 40 is provided. The turn-off pulse illustrated by pulse 53 of FIG. 2 at the collector of transistor 26 is differentiated by capacitor 41 and resistor 42 to provide a pulse at the base of transistor 40. Pulse 53 switches transistor 40 on to complete a current path from source 36 through winding 45. Windings 45 and 46 are tightly coupled, that is, have a high mutual inductance or coupling coefficient, so that a high reverse voltage is applied from winding 46 to the base of transistor 23. A reverse current pulse 54 flows out of transistor 23 to rapidly switch transistor 23 to a nonconducting state or off in the desired manner. The duration of the turn-off pulses applied to the base of transistor 23 should be sufficiently long to hold transistor 23 cut-off during the entire retrace interval.

The above-described horizontal deflection system and waveforms apply generally to a fixed or constant duty cycle deflection systems. As was indicated above, however, the invention can be used advantageously in self-regulating horizontal deflection systems of the type wherein the conduction of transistor 23 is modulated during the first half of trace to provide a regulating function. In such systems circuits 24 and 25 include feedback means for providing a signal to oscillator 20 indicative of an unregulated supply voltage. Oscillator 20 provides a pulse width modulated output signal in response to the feedback signal to vary the duty cycle of the horizontal deflection circuit and to cause transistor 23 to operate as a switching regulator during the first half of the trace interval as is described in the above-referenced co-pending application Ser. No. 600,403. The waveforms of FIG. 2 generally correspond to a high unregulated voltage condition wherein transistor 23 conducts for its minimum interval of the last half of trace. If the unregulated voltage is low, the output pulses from oscillator 20 are width modulated during the first half of trace so that transistors 26, 34, and 23 began conduction before the electron beam reaches the center of the screen. In this type of system coupling circuit 24 includes a supply transformer for regulating the supply voltage and circuitry for isolating transistor 23 from the horizontal deflection winding during the first half of trace when the damper diode is conducting.

Figure 3:
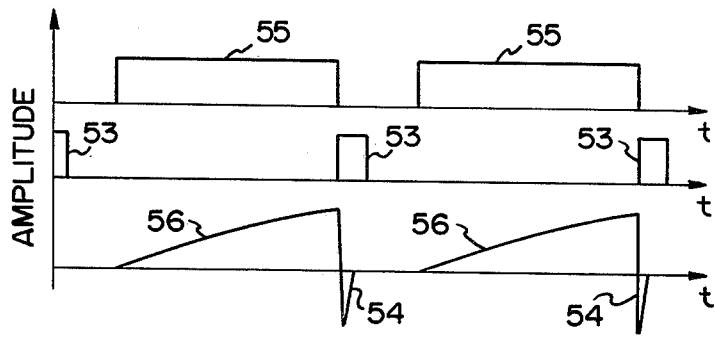

The waveforms of FIG. 3 generally corresponds to a low unregulated voltage condition wherein pulses 55 are width modulated to cause transistor 23 to conduct during the first half of trace. It is readily seen that with prior art transformer coupled drivers the variation in conduction time or duty cycle of the driver and output transistor will deleteriously affect the operation of the deflection system. In the embodiment illustrated in FIG. 1, however, the base drive current is integrated by the leakage inductance between windings 35 and 46 of transformer 22 to provide a sawtooth drive current illustrated by waveform 56 of FIG. 3. It has been found that when the embodiment of the invention illustrated in FIG. 1 is used in a self-regulating horizontal deflection system, the peak base current in the forward direction is maintained relatively constant. That is, the final base drive current increases only slightly in magnitude with increasing duty cycle of horizontal output transistor 23. Thus, substantial power dissipation is avoided in the driver circuit and in the base circuit of transistor 23 whereby decreasing power consumption and heat generation of the horizontal deflection system.

In a typical prior art transformer coupled deflection system, variations in driver duty cycle deleteriously effect the turn-off pulses applied to the base of transistor 23. In the illustrated embodiment of the invention, however, turn-off or retrace pulses 53 are determined independently so that the reverse base current pulse 54 remains substantially independent of the forward drive duty cycle.

Figure 4:
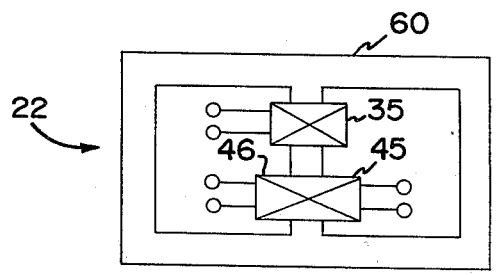
FIG. 4 is a schematic illustration of one embodiment of a driver transformer in accordance with the invention.

In one practical embodiment of the invention a transformer in accordance with that illustrated schematically in FIG. 4 was used. In FIG. 4 windings 35, 45, and 46 are disposed on the center leg of a two-window core 60. Output winding 46 comprised 15 turns of No. 24 wire with approximately 105 microhenries inductance. Winding 45 comprised 150 turns of No. 28 wire disposed on top of winding 46. Winding 45 had an inductance of approximately 9.3 millihenries. Winding 35 comprised 150 turns of No. 28 wire disposed in spaced relationship from windings 45 and 46. Winding 35 had about 8.7 millihenries inductance. The tight coupling or relatively high coupling coefficient between windings 45 and 46 is illustrated as being obtained by placing one winding on top of the other winding. Other forms of tight coupling are known and will be evident to those skilled in the art. The loose coupling or relatively low coupling coefficient between windings 35 and 46 was obtained by spacing the windings. Other forms of loose coupling are also known and will be evident to those skilled in the art. Those skilled in the art will further realize that cores other than the type illustrated can be used within the scope of the invention.

Accordingly, there has been illustrated and described a novel deflection circuit for a horizontal deflection system which provides numerous advantages over the prior art. A deflection circuit in accordance with the invention has lower power consumption than prior art transformer coupled driver circuits. Better forward and reverse drive characteristics are also achieved with less power dissipation than in prior art circuits. Furthermore, the invention can be used with either conventional fixed duty cycle deflection systems or self-regulating deflection systems. In self-regulating deflection systems the peak forward base current of the output transistor is maintained relatively constant so that excessive base drive is not provided and the operation in the circuit is not deleteriously affected by varying duty cycles.

While there has been shown and described what is at present considered the preferred embodiment of the invention it will be obvious to those skilled in the art that various changes and modifications may be made therein without departing from the invention as defined by the appended claims.

What is claimed is:

1. In a horizontal deflection system for a television receiver having an oscillator for providing a signal synchronized with a received composite video signal and a deflection yoke associated with a cathode ray tube, a deflection circuit comprising:
    a horizontal output transistor having an output electrode connected in circuit with said deflection yoke for providing a sawtooth deflection current thereto;
    first and second semiconductor drivers connected to said oscillator; and
    a transformer having an output winding connected to an input electrode of said horizontal output transistor, a first input winding connected to said first semiconductor driver and having a low coupling coefficient with said output winding for providing a sawtooth drive current from said output winding to said input electrode sufficient to cause said horizontal output transistor to conduct in saturation in response to energization of said first input winding by said first semiconductor device, and a second input winding connected to said second semiconductor driver and having a high coupling coefficient with said output winding for causing a reverse current to flow from said input electrode to rapidly switch said horizontal output transistor to a non-conducting state.

2. A deflection circuit as defined in claim 1 wherein said transformer includes a core, said output winding and said second input winding are wound on said core in close proximity, and said first input winding is wound on said core in spaced relation with the other windings.

3. A deflection circuit as defined in claim 1 wherein said first and second semiconductor drivers each include a transistor switch.

4. A deflection circuit as defined in claim 1 wherein the signal provided by said oscillator has a predetermined duty cycle.

5. A deflection circuit as defined in claim 1 wherein the signal provided by said oscillator is pulse width modulated to cause said horizontal output transistor to provide voltage regulation by varying the conduction time thereof.

6. In a self-regulating horizontal deflection system for a television receiver having an oscillator for providing a pulse width modulated signal synchronized with a received composite video signal, a deflection yoke associated with a cathode ray tube, and feedback means for providing a signal indicative of an unregulated supply voltage to said oscillator, a deflection circuit comprising:
    a horizontal output transistor having a collector connected in circuit with said deflection yoke for providing a sawtooth deflection current thereto and connected to said feedback means;
    first and second semiconductor drivers connected to said oscillator for receiving said pulse width modulated signal therefrom; and
    a transformer having an output winding connected to a base of said horizontal output transistor, a first input winding connected to said first semiconductor driver and having a low coupling coefficient with said output winding for providing a sawtooth drive current from said output winding to said base sufficient to cause said horizontal output transistor to conduct in saturation in response to energization of said first input winding by said first semiconductor driver, and a second input winding connected to said second semiconductor driver and having a high coupling coefficient with said output winding for causing a reverse current to flow from said base to rapidly switch said horizontal output transistor to a non-conducting state.

7. A deflection circuit as defined in claim 6 wherein said first and second semiconductor drivers each include a transistor switch.

8. A deflection circuit as defined in claim 6 wherein said transformer includes a core, said output winding and said second input winding are wound on said core in close proximity, and said first input winding is wound on said core in spaced relation with the other windings.

9. A deflection circuit as defined in claim 8 wherein said output winding and said second input winding are wound one on top of the other.

* * * * *